(12) United States Patent
Ho et al.

(10) Patent No.: US 11,296,444 B2
(45) Date of Patent: Apr. 5, 2022

(54) EDGE-TO-EDGE BOARD CONNECTION STRUCTURE

(71) Applicants: QING DING PRECISION ELECTRONICS (HUAIAN) CO., LTD, Huai an (CN); Avary Holding (Shenzhen) Co., Limited., Shenzhen (CN)

(72) Inventors: Ming-Jaan Ho, New Taipei (TW); Man-Zhi Peng, Huaian (CN)

(73) Assignees: QING DING PRECISION ELECTRONICS (HUAIAN) CO., LTD, Huai an (CN); Avary Holding (Shenzhen) Co., Limited., Shenzhen (CN)

( * ) Notice: Subject to any disclaimer, the term of this patent is extended or adjusted under 35 U.S.C. 154(b) by 0 days.

(21) Appl. No.: 17/033,842

(22) Filed: Sep. 27, 2020

(65) Prior Publication Data

US 2022/0052471 A1 Feb. 17, 2022

(30) Foreign Application Priority Data

Aug. 12, 2020 (CN) .......................... 202010808798.8

(51) Int. Cl.
*H01R 12/72* (2011.01)
*H01R 43/26* (2006.01)
*H01R 43/20* (2006.01)

(52) U.S. Cl.
CPC ......... *H01R 12/727* (2013.01); *H01R 43/205* (2013.01); *H01R 43/26* (2013.01)

(58) Field of Classification Search
CPC ..... H01R 12/727; H01R 43/205; H01R 43/26
See application file for complete search history.

(56) References Cited

U.S. PATENT DOCUMENTS

| | | | | |
|---|---|---|---|---|
| 4,495,079 | A * | 1/1985 | Good ...................... | A61K 8/31 510/131 |
| 5,044,963 | A * | 9/1991 | Kukkonen ........... | H05K 1/0219 439/55 |
| 6,328,574 | B1 * | 12/2001 | Howell .............. | H01R 12/7088 439/69 |
| 6,345,989 | B1 * | 2/2002 | Mason .................. | H05K 3/366 439/65 |
| 6,548,766 | B2 * | 4/2003 | Daido ................. | H05K 3/0052 174/255 |

(Continued)

*Primary Examiner* — Vanessa Girardi
(74) *Attorney, Agent, or Firm* — ScienBiziP, P.C.

(57) ABSTRACT

A board-to-board connection structure includes a first circuit board, a second circuit board, and a connector. The first circuit board includes a first base layer and a first outer circuit layer. The second circuit board includes a second base layer and a second outer circuit layer. The connector electrically couples the first circuit board and the second circuit board. The connector includes a housing, a first electrical connection portion, and a second electrical connection portion. A side surface of the first circuit board includes a first conductive layer electrically coupled to the first outer circuit layer. The connector is coupled to the first conductive layer through the first electrical connection portion. The second circuit board is located in the housing, and the second electrical connection portion is electrically coupled to the second outer circuit layer.

11 Claims, 13 Drawing Sheets

(56) References Cited

U.S. PATENT DOCUMENTS

| | | | | |
|---|---|---|---|---|
| 6,554,654 B1* | 4/2003 | Stoddard | ............ | H01R 13/2471 |
| | | | | 439/59 |
| 6,558,169 B2* | 5/2003 | Figueroa | ................. | H01L 23/50 |
| | | | | 439/70 |
| 6,721,187 B2* | 4/2004 | Hall | ...................... | H05K 3/403 |
| | | | | 361/760 |
| 8,044,861 B2* | 10/2011 | Pedersen | ................ | H05K 3/366 |
| | | | | 343/700 MS |
| 10,398,025 B2* | 8/2019 | Takken | ................. | H05K 3/366 |

* cited by examiner

10

EDGE-TO-EDGE BOARD CONNECTION STRUCTURE

FIELD

The subject matter herein generally relates to circuit boards, and more particularly to a board-to-board connection structure and a method for manufacturing the board-to-board connection structure.

BACKGROUND

With the wide application of printed circuit boards, two or more circuit boards with different functions may be integrated.

In the related art, a connection method includes connection through an anisotropic conductive adhesive (ACF), pulse hot bar welding, and a board-to-board (BTB) connector.

However, the above-mentioned connection methods will increase the total thickness of the circuit board due to the existence of an inter-board connection layer, which cannot meet the development trend of thinning and bending of electronic products.

BRIEF DESCRIPTION OF THE DRAWINGS

Implementations of the present disclosure will now be described, by way of embodiments, with reference to the attached figures.

DETAILED DESCRIPTION

Figure 1:
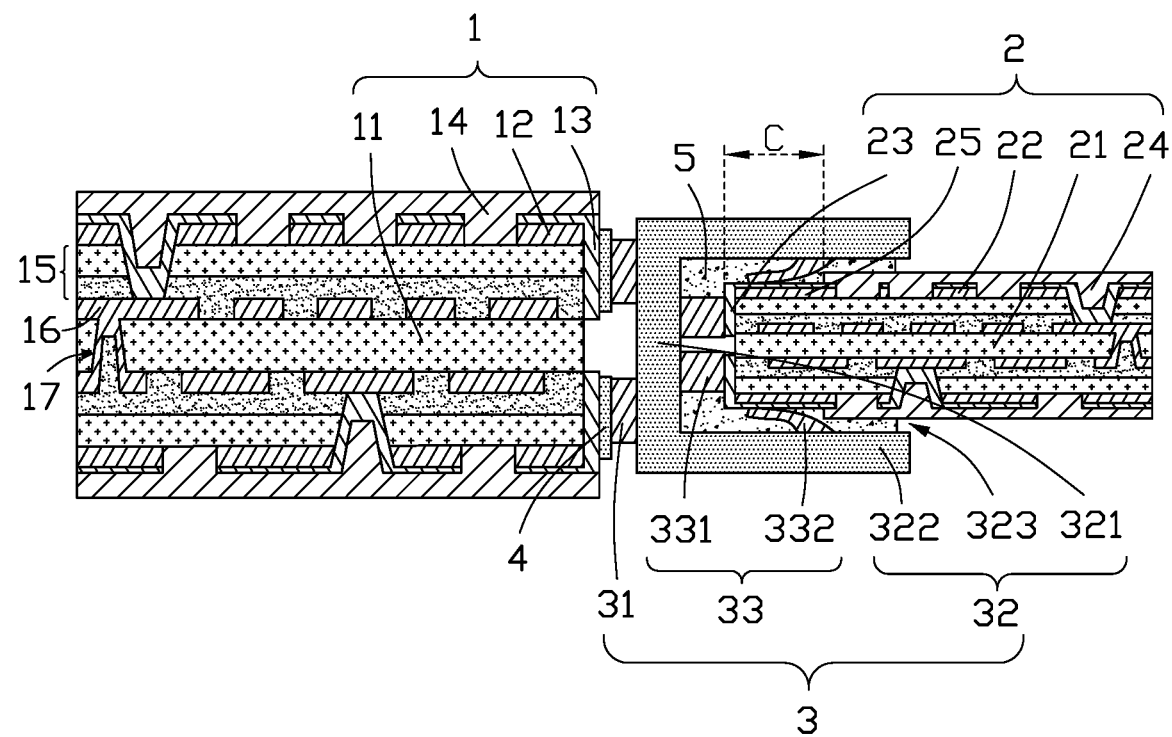
FIG. 1 is a schematic structural diagram of a board-to-board connection structure provided by an embodiment of the present disclosure.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to", it specifically indicates open-ended inclusion or membership in a so-described combination, group, series, and the like.

Figure 2:
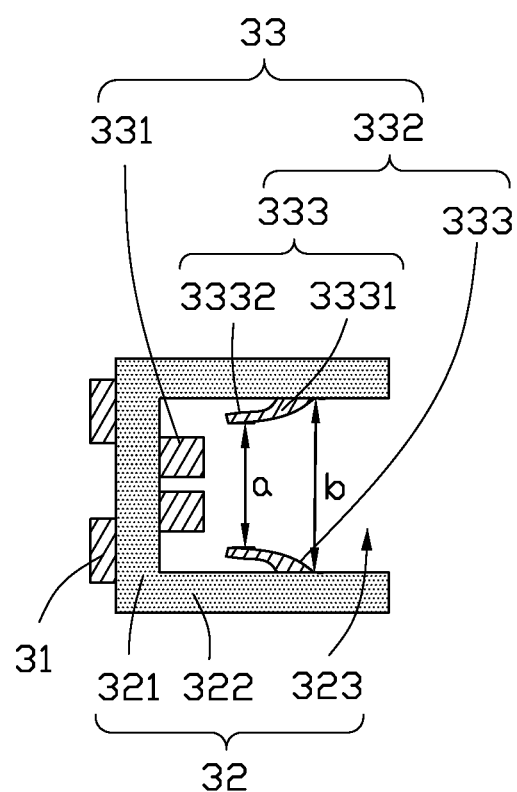
FIG. 2 is a schematic structural diagram of a connector of the board-to-board connection structure of FIG. 1.
Figure 3:
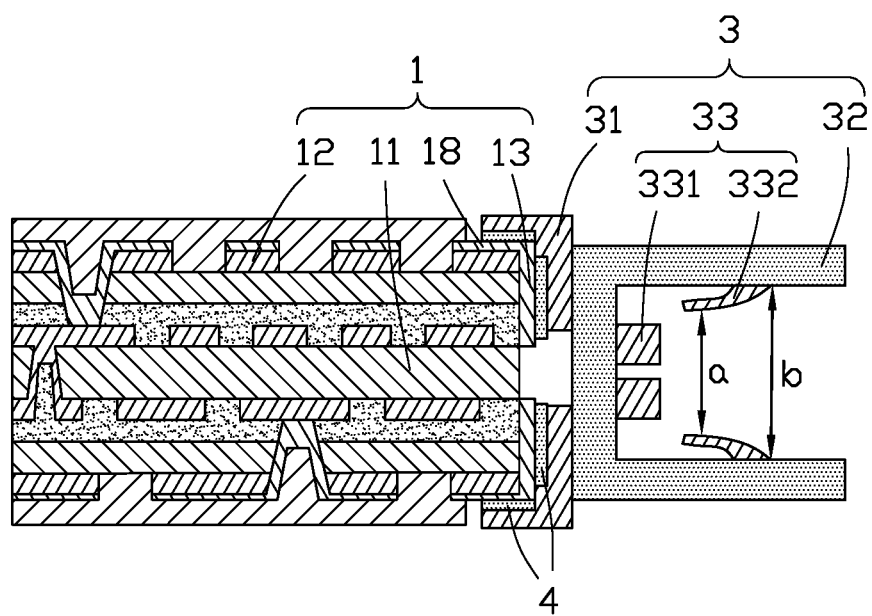
FIG. 3 is a schematic diagram of the board-to-board connection structure of FIG. 1, when a second circuit board is removed.

FIGS. 1-3 show an embodiment of a board-to-board connection structure 1000 including a first circuit board 1, a second circuit board 2, and a connector 3. The connector 3 electrically couples the first circuit board 1 and the second circuit board 2. The connector 3 includes a housing 32, a first electrical connection portion 31 located outside the housing 32, and a second electrical connection portion 33 located in the housing 32 and electrically coupled to the first electrical connection portion 31.

The first circuit board 1 includes a first base layer 11 and a first outer circuit layer 12 located on the first base layer 11. A side of the first circuit board 1 is provided with a first conductive layer 13 electrically coupled to the first outer circuit layer 12. The second circuit board 2 includes a second base layer 21 and a second outer circuit layer 22 located on the second base layer 21. A side of the second circuit board 2 is provided with a second conductive layer 23 electrically coupled to the second outer circuit layer 22. The connector 3 is coupled to the first conductive layer 13 through the first electrical connection portion 31. The second circuit board 2 is located in the housing 32. The second electrical connection portion 33 is electrically coupled to the second outer circuit layer 22 and the second conductive layer 23 to realize electrical coupling between the first circuit board 1 and the second circuit board 2.

In one embodiment, the first conductive layer 13 and the second conductive layer 23 may both be metal plating layers. The metal may be at least one of copper (Cu), titanium (Ti), nickel (Ni), and gold (Au).

In one embodiment, the second electrical connection portion 33 includes at least one contact 331 and at least one clamping device 332 provided in the housing 32. The contact 331 is electrically coupled to the second conductive layer 23. The clamping device 332 is electrically coupled to the second outer circuit layer 22.

In one embodiment, the housing 32 includes an end wall 321, a side wall 322 located around the end wall 321, and an opening 323 located opposite the end wall 321. The first electrical connection portion 31 is disposed on an outer side of the end wall 321, the contact 331 is disposed on an inner side of the end wall 321, and the first electrical connection portion 31 is electrically coupled to the contact 331. The clamping device 332 is arranged on the side wall 322. One end of the second circuit board 2 is inserted into the housing 32 through the opening 323, and the clamping device 332 can clamp two opposite surfaces of the second circuit board 2 to achieve fixing and electrical connection. At the same time, the clamping device 332 is electrically coupled to the second outer circuit layer 22 on the second circuit board 2. Since the connector 3 is located on the side of the first circuit board 1, when the second circuit board 2 is inserted into the connector 3 from the opening 323, an overall thickness of the board-to-board connection structure 1000 is not increased, which is conducive to the development of lighter and thinner electronic products.

As shown in FIGS. 1 and 2, in one embodiment, the housing 32 is substantially a hollow cuboid structure, that is, four sides of the end wall 321 are respectively provided with a side wall 322, and the four side walls 322 are coupled end to end to form a frame structure. The opening 323 is provided opposite the end wall 321 and is a rectangular opening.

In one embodiment, the clamping device 332 includes two oppositely arranged elastic pieces 333, and the two elastic pieces 333 are arranged on two oppositely arranged side walls 322. After the end of the second circuit board 2 is inserted into the housing 32, the two elastic pieces 333 are used to clamp the second circuit board 2 from opposite sides of the second circuit board 2. The elastic pieces 333 abut against the second outer circuit layer 22 to achieve fixing and electrical connection.

In one embodiment, each elastic piece 333 includes a connecting portion 3331 disposed on the side wall 322 and an elastic body 3332 coupled to the connecting portion 3331. The two elastic bodies 3332 are oppositely arranged and protrude toward each other. It can be understood that a first distance a between the two oppositely arranged elastic bodies 3332 is smaller than a second distance b between the two connecting portions 3331. The elastic body 3332 is elastic. When the second circuit board 2 is inserted into the housing 32, the elastic bodies 3332 are bent toward the corresponding side walls 322, and a restoring force of the two elastic bodies 3332 acts on the two sides of the second circuit board 2 to clamp and fix the second circuit board 2 in the housing 32.

In one embodiment, after the two elastic bodies 3332 are clamped on the two sides of the second circuit board 2, the elastic bodies 3332 and the second outer circuit layer 22 are soldered together to further fix the second circuit board 2. Specifically, a reflow soldering process can be used for soldering. At the same time, the contact 331 and the second conductive layer 23 can also be soldered together by the above-mentioned soldering process, and the soldering process can improve a connection firmness between the second circuit board 2 and the connector 3.

In one embodiment, there are two clamping devices 332. The two clamping devices 332 include four elastic pieces 333 arranged in pairs opposite each other, and the four elastic pieces 333 are respectively arranged on the four side walls 322, so that the second circuit board 2 can be clamped and fixed from four sides. At the same time, according to the design flexibility of the clamping device 332 described above, combined with the actual wiring of the second circuit board 2, multi-directional electrical connections can be realized. For example, for a double-layer board, a minimum of three sides of the second circuit board 2 can be coupled (an end surface, an upper surface, and a lower surface of the second circuit board 2), and a maximum of five side of the second circuit board 2 can be coupled (an end surface, an upper surface, a lower surface, a left side, and a right side). Through the above-mentioned position design of the clamping device 332, the connection area between the second circuit board 2 and the connector 3 can be effectively increased, which can be adapted to the design requirements of different circuit boards.

In one embodiment, the contact 331 and the clamping device 332 are both made of conductive materials, which can realize the electrical connection between the second circuit board 2 and the first electrical connection portion 31. Specifically, the conductive material may be a metal sheet or a plastic sheet added with conductive metal particles. The metal can be at least one of copper (Cu), titanium (Ti), nickel (Ni), gold (Au), or other suitable metals, alloys, or combinations thereof.

As shown in FIGS. 1 and 3, in one embodiment, the first electrical connection portion 31 and the first conductive layer 13 are electrically coupled through a third conductive layer 4.

In one embodiment, the third conductive layer 4 includes conductive paste or conductive adhesive, which may be solder paste. Specifically, a solder paste can be formed on the first conductive layer 13 by coating, and then the connector 3 can be coupled. In another embodiment, a photocurable solder ball can be implanted on the first conductive layer 13 to couple the connector 3 and then be light-cured. In order to increase the area for dispensing glue or solder paste, the area of the first electrical connection portion 31 can be appropriately increased to make the connection stronger and more stable.

As shown in FIG. 3, in one embodiment, the first outer circuit layer 12 includes a first connection pad 18 located at the edge of the first circuit board 1. The first electrical connection portion 31 covers the first connection pad 18, and the third conductive layer 4 is also located between the first connection pad 18 and the first electrical connection portion 31, thereby firmly and stably electrically coupling the first circuit board 1 and the connector 3.

As shown in FIGS. 1 and 3, in one embodiment, a surface of the first outer circuit layer 12 is covered with a first covering layer 14, and the first connection pad 18 is exposed through the first covering layer 14. Specifically, the first covering layer 14 may be a solder resist layer.

As shown in FIG. 1, in one embodiment, the first circuit board 1 is a four-layer board, and both surfaces of the first base layer 11 are provided with the first outer circuit layer 12, and correspondingly there are two first conductive layers 13. The two first conductive layers 13 are respectively electrically coupled to the corresponding first outer circuit layer 12. Correspondingly, there are two first electrical connection portions 31, which are respectively provided corresponding to the two first conductive layers 13.

The first base layer 11 is further provided with an inner circuit layer 16 and a first dielectric layer 15. The inner circuit layer 16 and the first outer circuit layer 12 are electrically coupled through vias 17.

In one embodiment, the second circuit board 2 further includes a second covering layer 24 disposed on the second outer circuit layer 22. Specifically, the second covering layer 24 may be a solder resist layer. The second outer circuit layer 22 includes a second connection pad 25 located at the edge of the second circuit board 2, and the second connection pad 25 is exposed outside the second covering layer 24. The second connection pad 25 is located in the housing 32 and is electrically coupled to the clamping device 332. Specifically, a width c of the second connection pad 25 is related to the arrangement of the clamping device 332 in the housing 32. The width c refers to a width along a connection direction of the two circuit boards.

In one embodiment, a fixing adhesive 5 is filled between the housing 32 and the second circuit board 2, and the fixing adhesive 5 can improve the connection stability between the second circuit board 2 and the connector 3. At the same time, the electrical connection effect between the second circuit board 2 and the connector 3 can be effectively improved, and short circuits can be avoided.

Referring to FIGS. 4-13, a method for preparing the above-mentioned board-to-board connection structure 1000 specifically includes the following steps.

Figure 4:
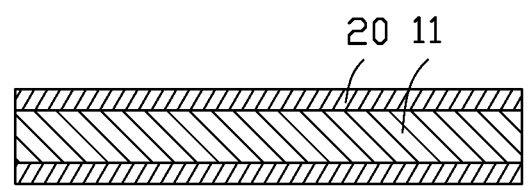
FIG. 4 is a schematic diagram of a first double-sided copper clad laminate provided by an embodiment of the present disclosure.

In a first step, referring to FIG. 4, a first double-sided copper clad laminate 10 is provided. The first double-sided copper clad laminate 10 includes the first base layer 11 and a first copper foil layer 20 covering both surfaces of the first base layer 11.

Figure 5:
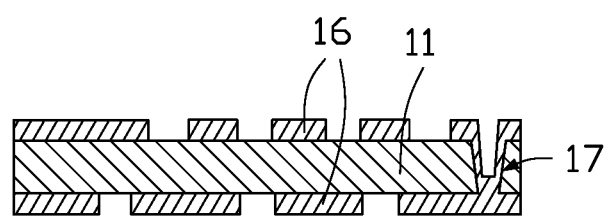
FIG. 5 is a schematic diagram wherein two first copper foil layers of the first double-sided copper clad laminate of FIG. 1 are etched, an a via hole is formed in the first double-sided copper clad laminate.

In a second step, referring to FIG. 5, the two first copper foil layers 20 are etched through an exposure and development process to prepare the inner circuit layers 16. A via 17 is formed in the first base layer 11, and the two inner circuit layers 16 are electrically coupled through the via 17.

Figure 6:
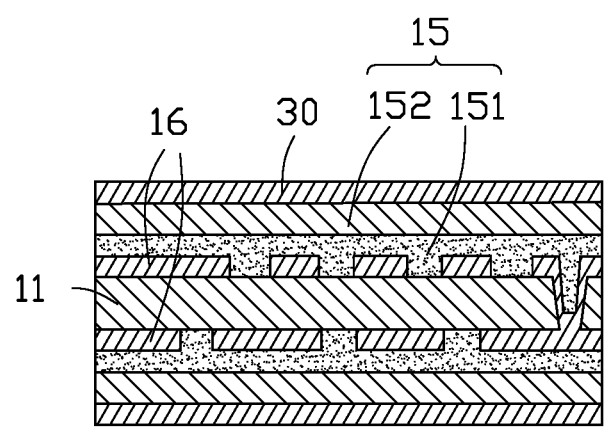
FIG. 6 is a schematic diagram wherein a first dielectric layer and a second copper foil layer are covered on inner circuit layers of FIG. 5.

In a third step, referring to FIG. 6, a first dielectric layer 15 and a second copper foil layer 30 are covered on each of the inner circuit layers 16 to obtain an intermediate structure 100. The first dielectric layer 15 includes a first adhesive layer 151 and a first insulating layer 152, and the first adhesive layer 151 is located between the inner circuit layer 16 and the first insulating layer 152.

Figure 7:
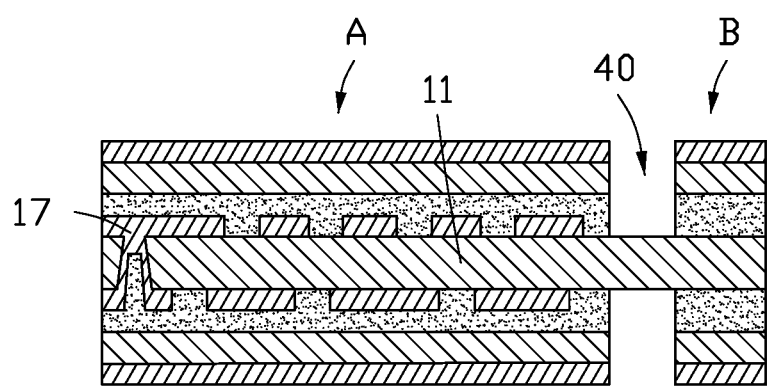
FIG. 7 is a schematic diagram wherein a slot is defined in each second copper foil layer and the corresponding first dielectric layer of FIG. 6.

In a fourth step, referring to FIG. 7, a slot 40 is defined in each second copper foil layer 30 and the corresponding first dielectric layer 15, so as to divide the intermediate structure 100 into a finished product area A and a waste area B. The slot 40 does not penetrate the first base layer 11, that is, the finished product area A and the waste area B are only coupled by the first base layer 11.

Figure 8:
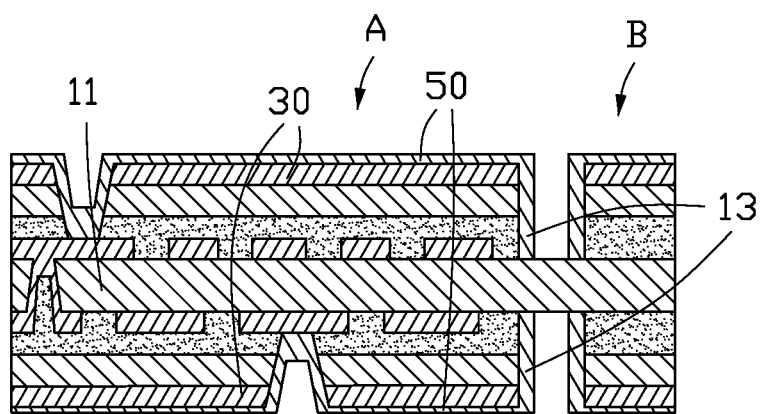
FIG. 8 is a schematic diagram wherein surface electroplating is performed on each second copper foil layer of FIG. 7 to form an electroplated layer.

In a fifth step, referring to FIG. 8, surface electroplating is performed on each of the second copper foil layers 30 to form an electroplated layer 50. The electroplated layer 50 extends to a side surface of the finished product area A to form the first conductive layer 13.

Figure 9:
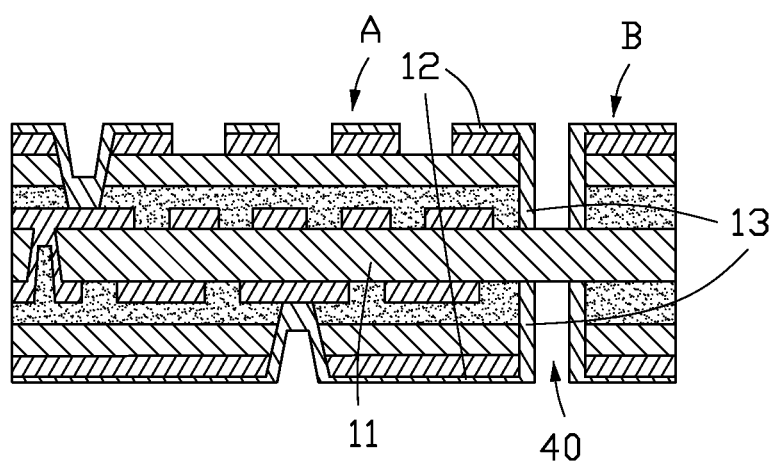
FIG. 9 is a schematic diagram wherein each second copper foil layer and the corresponding electroplating layer of FIG. 8 are exposed and developed to obtain a first outer circuit layer.

In a sixth step, referring to FIG. 9, each of the second copper foil layer 30 and the corresponding electroplating layer 50 are exposed and developed to obtain the first outer circuit layer 12. The inner circuit layer 16 and the first outer circuit layer 12 located on the same side are electrically coupled through the via 17.

Figure 10:
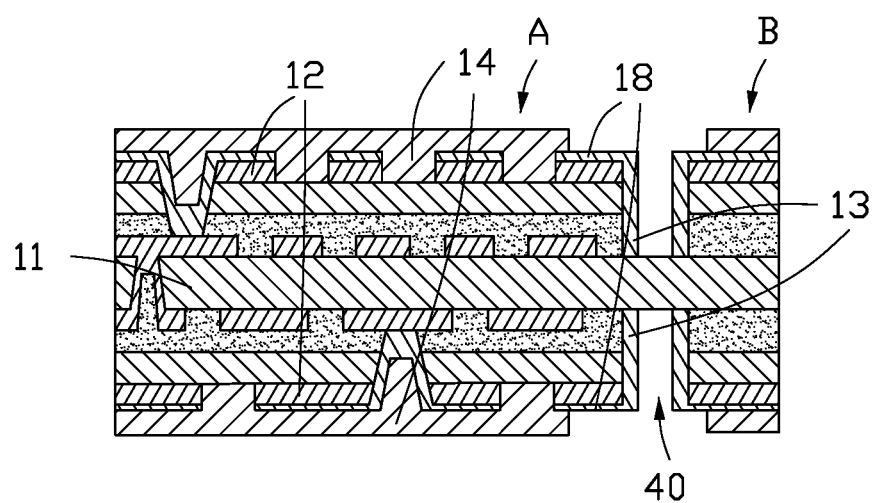
FIG. 10 is a schematic diagram wherein a first covering layer is covered on the first outer circuit layer of FIG. 9.

In a seventh step, referring to FIG. 10, a first covering layer 14 is covered on the surface of the first outer circuit layer 12, and the first covering layer 14 may be a solder resist layer.

When covering the first covering layer 14, it is necessary to consider whether the edge close to the first conductive layer 13 needs to be fully covered. If full covering is not required, the edge of the first outer circuit layer 12 can be exposed. In one embodiment, a portion of the first outer circuit layer 12 is exposed to the first cover layer 14 to form the first connection pad 18.

Figure 11:
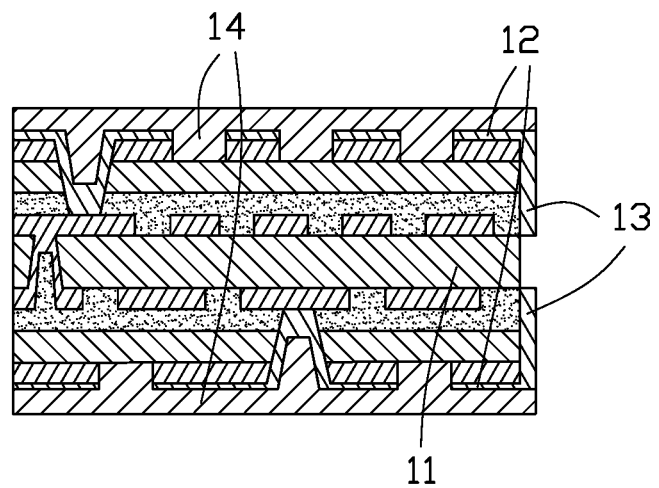
FIG. 11 is a schematic diagram wherein a portion of a first base layer of FIG. 10 corresponding to the slot is removed.

In an eighth step, referring to FIG. 11, a portion of the first base layer 11 corresponding to the slot 40 is removed, thereby separating the finished product area A from the waste area B, and the first circuit board 1 is obtained.

Figure 12:
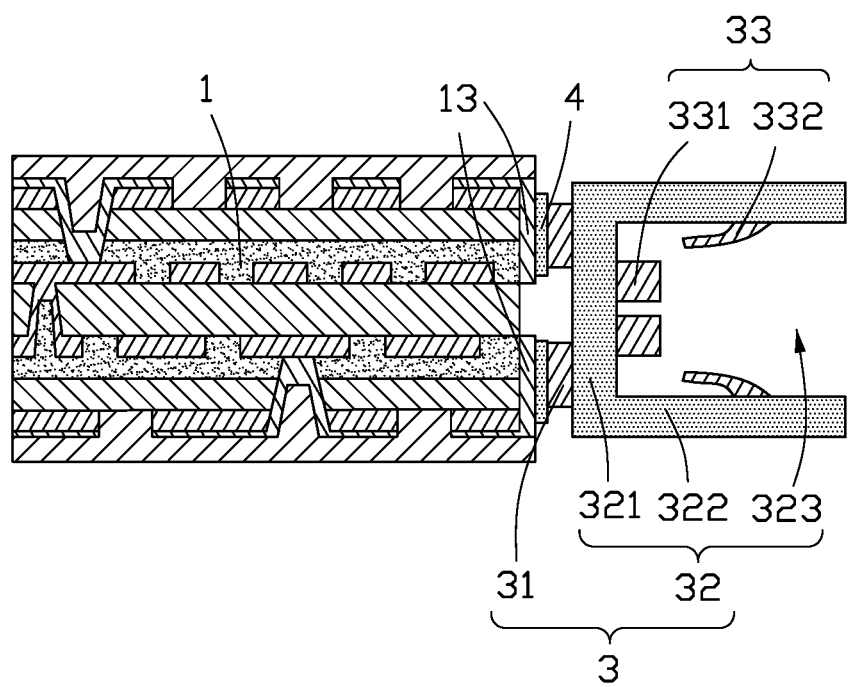
FIG. 12 is a schematic diagram wherein the connector is fixed on a first conductive layer of FIG. 11.

In a ninth step, referring to FIG. 12, the connector 3 is provided, and the first electrical connection portion 31 is fixed on the first conductive layer 13 through the third conductive layer 4.

In one embodiment, the third conductive layer 4 includes conductive paste or conductive adhesive, which may be solder paste. Specifically, a solder paste can be formed on the first conductive layer 13 by coating, and then the connector 3 can be coupled. In another embodiment, a photocurable solder ball can be implanted on the first conductive layer 13 to couple the connector 3 and then be light cured. In order to increase the area for dispensing glue or solder paste, the area of the first electrical connection portion 31 can be appropriately increased to make the connection stronger and more stable.

In one embodiment, the first electrical connection portion 31 covers the first connection pad 18, and the third conductive layer 4 is also located between the first connection pad 18 and the first electrical connection portion 31, so that the first circuit board 1 and the connector 3 are stably and firmly electrically coupled.

In one embodiment, the first electrical connection portion 31 is a metal plating layer formed on the housing 32. When it is necessary to increase the contact area with the first conductive layer 13, it is only necessary to increase the area of the metal plating layer, which can be flexibly adjusted according to the actual circuit board wiring structure.

Figure 13:
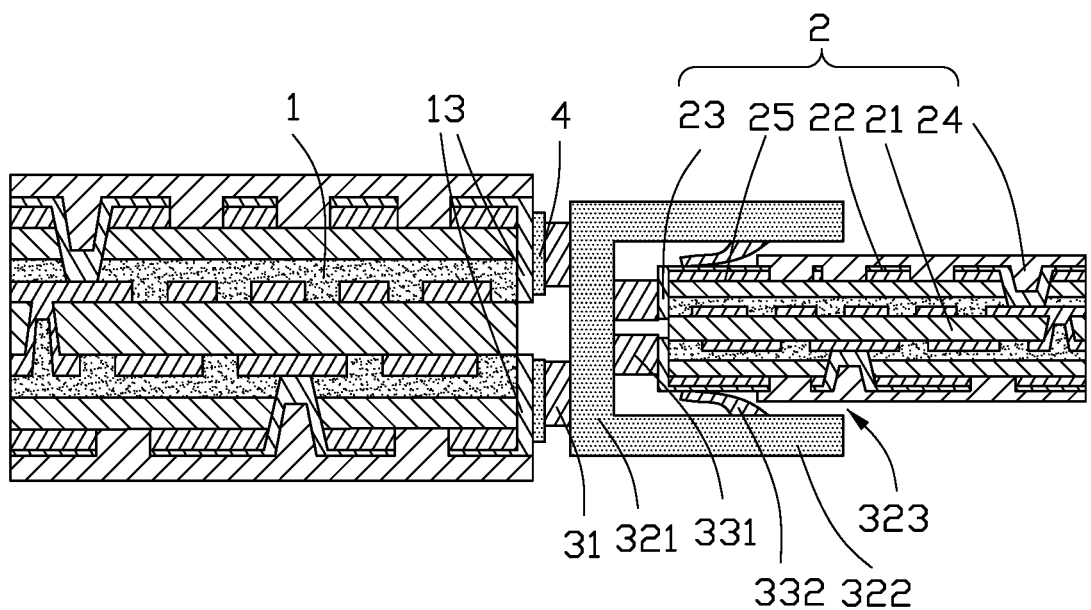
FIG. 13 is a schematic diagram wherein the second circuit board is inserted into a housing of the connector of FIG. 12 to obtain the board-to-board connection structure.

In a tenth step, referring to FIG. 13, the second circuit board 2 is provided. A preparation method of the second circuit board 2 can correspond to the first through eighth steps of the preparation method of the first circuit board 1. When the surface of the second outer circuit layer 22 covers the second covering layer 24, a portion of the second outer circuit layer 22 is exposed from the second covering layer 24 to form the second connection pad 25.

Then, the second circuit board 2 is inserted into the housing 32, the second conductive layer 23 is electrically coupled to the contact 331, and the clamping device 332 is electrically coupled to the second connection pad 25.

In one embodiment, the second circuit board 2 is a four-layer board with two upper and lower layers of the second outer circuit layer 22. By arranging a set of the clamping devices 332 in the housing 32, that is, two opposite side walls 322 are respectively provided with one elastic piece 333, and the two elastic pieces 333 are respectively clamped and contacted with the corresponding second connection pad 25 to realize the fixing of the second circuit board 2, electrical connection between the two sides can be achieved. Combined with the electrical connection of the second conductive layer 23 and the contact 331, electrical connection of three sides can be achieved.

In another embodiment, two sets of the clamping devices 332 may be provided in the housing 32, that is, four elastic pieces 333 are respectively arranged on the side walls 322, so that the second circuit board 2 and the connector 3 can electrically couple to five sides.

In an eleventh step, referring to FIG. 1 again, a fixing adhesive 5 is filled in the gap between the housing 32 and the second circuit board 2 to obtain the board-to-board connection structure 1000.

By filling the fixing adhesive 5, the connection between the housing 32 and the second circuit board 2 can be made more stable.

In this application, the first circuit board 1 and the second circuit board 2 include, but are not limited to, a flexible board, a rigid board, or a rigid-flex board, and can also be a double-sided board or a multilayer board with more conductive circuits. The specific number of circuit layers can be designed according to actual needs.

The board-to-board connection structure provided by the present disclosure has the following advantages:

1. The connector couples the sides of the first circuit board and the second circuit board to realize electrical connection, which ensures that the thickness after coupling does not increase, which is beneficial for the development of lighter and thinner electronic products.

2. The connector has a simple structure, and can be electrically coupled to the first circuit board through conductive adhesive or conductive paste, and the second circuit board only needs to be inserted into the housing through the opening to be fixed by the clamping device.

3. The design of the clamping device and the contact can realize multi-sided electrical connection according to the actual circuit board wiring structure design, which can effectively increase the connection area between the second circuit board and the connector, and is flexibly strong to adapt to the design requirements of different circuit boards.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A board-to-board connection structure, comprising:
   a first circuit board comprising a first base layer and a first outer circuit layer located on the first base layer;
   a second circuit board comprising a second base layer and a second outer circuit layer located on the second base layer; and
   a connector electrically coupling the first circuit board and the second circuit board; wherein:
   the connector comprises a housing, a first electrical connection portion located outside the housing, and a second electrical connection portion located in the housing and electrically coupled to the first electrical connection portion;
   a side surface of the first circuit board is provided with a first conductive layer electrically coupled to the first outer circuit layer; and
   the connector is coupled to the first conductive layer through the first electrical connection portion, the second circuit board is located in the housing, and the second electrical connection portion is electrically coupled to the second outer circuit layer.

2. The board-to-board connection structure of claim 1, wherein:
   the first outer circuit layer comprises a first connection pad;
   the first conductive layer is coupled to the first connection pad, and the first electrical connection portion is electrically coupled to the first connection pad and the first conductive layer.

3. The board-to-board connection structure of claim 1, wherein:
   the first electrical connection portion is fixed on the first conductive layer by conductive adhesive or conductive paste.

4. The board-to-board connection structure of claim 1, wherein:
   a second conductive layer electrically coupled to the second outer circuit layer is disposed on a side surface of the second circuit board.

5. The board-to-board connection structure of claim 4, wherein:
   the second electrical connection portion comprises at least one contact and at least one clamping device;
   the contact is electrically coupled to the second conductive layer;
   the clamping device comprises two oppositely arranged elastic pieces, the two elastic pieces configured to clamp the second circuit board.

6. The board-to-board connection structure of claim 5, wherein the second outer circuit layer comprises a second connection pad, and the elastic piece elastically abuts the second connection pad.

7. A method for preparing a board-to-board connection structure, the method comprising:
   providing a first circuit board, the first circuit board comprising a first base layer, a first outer circuit layer arranged on at least one surface of the first base layer, and a first conductive layer arranged on an end surface of the first circuit board, the first conductive layer electrically coupled to the first outer circuit layer;
   providing a connector, the connector comprising a housing, a first electrical connection portion located outside the housing, and a second electrical connection portion located in the housing and electrically coupled to the first electrical connection portion;
   fixing and electrically coupling the first electrical connection portion to the first conductive layer on a side of the first circuit board;
   providing a second circuit board, the second circuit board comprising a second base layer and a second outer circuit layer disposed on at least one surface of the second base layer; and
   inserting one end of the second circuit board inside the housing, the second outer circuit layer electrically coupled to the second electrical connection portion to obtain the board-to-board connection structure.

8. The method of claim 7, wherein:
   the first outer circuit layer comprises a first connection pad;
   the first conductive layer is coupled to the first connection pad; and
   the first electrical connection portion is electrically coupled to the first connection pad and the first conductive layer.

9. The method of claim 7, wherein:
   an end surface of the second circuit board adjacent to the first circuit board is provided with a second conductive layer; and
   the conductive layer is electrically coupled to the second outer circuit layer.

10. The method of claim 9, wherein:
    the second electrical connection portion comprises at least one contact and at least one clamping device;
    the contact is electrically coupled to the second conductive layer;
    the clamping device comprises two oppositely arranged elastic pieces for clamping the second circuit board.

11. The method of claim 10, wherein:
    the second outer circuit layer comprises a second connection pad; and the elastic sheet elastically abuts the second connection pad.

\* \* \* \* \*